United States Patent [19]

Takagi

[11] 4,003,071
[45] Jan. 11, 1977

[54] METHOD OF MANUFACTURING AN INSULATED GATE FIELD EFFECT TRANSISTOR

[75] Inventor: Sadaaki Takagi, Kawasaki, Japan

[73] Assignee: Fujitsu Limited, Kawasaki, Japan

[22] Filed: Mar. 3, 1975

[21] Appl. No.: 555,040

Related U.S. Application Data

[63] Continuation of Ser. No. 289,598, Sept. 18, 1972, abandoned.

[30] Foreign Application Priority Data

Sept. 18, 1971 Japan .............................. 46-72900
Dec. 27, 1971 Japan .............................. 47-1824
Dec. 28, 1971 Japan .............................. 47-3301
June 15, 1972 Japan .............................. 47-59746

[52] U.S. Cl. .................................. 357/42; 357/23; 357/52; 357/54
[51] Int. Cl.² ...................................... H01L 27/02
[58] Field of Search .................. 357/42, 23, 56, 52, 357/54

[56] References Cited

UNITED STATES PATENTS

| 3,386,163 | 6/1968 | Brennemann et al. | 357/42 |
| 3,417,464 | 12/1968 | Fang et al. | 357/42 |
| 3,580,745 | 5/1971 | Kool et al. | 357/42 |
| 3,696,276 | 10/1972 | Boland | 357/23 |

OTHER PUBLICATIONS

"Electronics," Oct. 26, 1970, p. 161.

*Primary Examiner*—Michael J. Lynch
*Assistant Examiner*—Joseph E. Clawson, Jr.
*Attorney, Agent, or Firm*—Staas & Halsey

[57] ABSTRACT

A method of manufacturing an insulated gate field effect transistor (hereinafter referred to as IGFET) of metal-insulating film-semiconductor construction in which a predetermined amount of impurity is introduced into the insulating film to produce immobile charges to thereby control the carrier concentration in the surface of the semiconductor and alter the conductivity type. A method developed from the above one for making an IGFET in which a transistor of depletion mode is coupled as a load with a transistor of enhancement mode.

3 Claims, 11 Drawing Figures

METHOD OF MANUFACTURING AN INSULATED GATE FIELD EFFECT TRANSISTOR

This is a continuation of application Ser. No. 289,598, filed Sept. 18, 1972 now abandoned.

BACKGROUND OF THE INVENTION

1. Field of the Invention

This invention relates to a method of manufacturing an IGFET having metal-insulating film-semiconductor construction, and more particularly to a method of manufacturing an insulated gate field effect transistor (IGFET), in which a predetermined amount of impurity is introduced into the insulating film to produce immobile charges to control the carrier concentration in the surface of the semiconductor and alter the conductivity type, and to a method developed from the above one which facilitate fabrication of an IGFET in which a transistor of depletion mode is coupled as a load with a transistor of enhancement mode.

2. Description of the Prior Art

In the prior art, the IGFET's are classified into N-channel and P-channel types according to the carrier conductivity type and are also divided into those which conduct at zero bias (depletion mode) and those which do not conduct at zero bias (enhancement mode) according to the mode of operation.

In the transistor of enhancement mode of operation, the gate bias and the drain bias are of the same polarity, so that direct interstage coupling is possible and various integrated circuits are produced utilizing this property. It is advantageous in these integrated circuits that the load is a transistor, which is normally in an off state, and accordingly power loss is relatively small. Where the load is the transistor of depletion mode, it is possible to improve the switching characteristic by interconnecting its gate and source electrodes to hold the transistor in the on state at all times.

Silicon dioxide formed on the surface of a silicon semiconductor tends to make the surface a little N-type and the P-channel type transistor of enhancement mode is easy to produce but the P-channel type transistor of depletion mode is difficult to produce.

One method for manufacturing the transistor of depletion mode is to diffuse boron through a gate oxide film into an N-type silicon substrate by an ion implantation method to lower the concentration in the surface of the substrate to form a P-channel thin; but an ion implantation device is extremely expensive and its production is very difficult to control. Another method is to induce the P-channel by using as a gate insulating film an alumina film including negative charges therein; but, this method is less than desirable because of the combined use of an oxide film with the alumina film, the difficulty in the control of the film thickness and the unsatisfactory reproducibility due to difficulty in the control of the charge in the film.

SUMMARY OF THE INVENTION

Accordingly, this invention relates to improvements in the prior art techniques described above and has its primary object to provide a method of manufacturing the IGFET of depletion mode with more ease.

Another object of this invention is to provide a simple and practical method of manufacturing the IGFET of the type that transistors of enhancement mode and depletion mode are coupled with each other to provide for improved switching characteristic.

Another object of this invention is to provide a method of manufacturing transistors of both the enhancement and the depletion mode simultaneously by a diffusion method utilizing the properties of a polycrystalline silicon film, a thin silicon dioxide film and an insulating film such as a nitride film, as a result of the facts that the polycrystalline silicon film and the thin silicon dioxide film permit the diffusion therethrough of an impurity such as boron and that the nitride or like insulating film inhibits the passage therethrough of such an impurity, even if the film is thin.

Still another object of this invention is to provide a method by which, simultaneously with the formation of source and drain diffused layers of transistors of the enhancement and the depletion mode, a necessary impurity diffused layer is formed under a gate insulating film of the transistor of depletion mode.

Briefly stated, according to this invention, a predetermined amount of impurity providing either a P- or N-type conductivity is introduced into an insulating film of high purity thereby to adjust either the charge distribution in the surface of a semiconductor or the conductivity type thereof. For the formation of transistors of both modes on the same substrate, the thicknesses of the insulating films are selected different for the respective transistors and the same impurity as mentioned previously is introduced into the substrate through the insulating film to provide the transistors of both modes. It has been ascertained that where boron is used as the impurity, it diffuses into the semiconductor substrate through the insulating films such as thin silicon dioxide and monocrystalline silicon films and that, in such a case, the impurity diffusion depth as well as the impurity concentration are less than those in the case of the impurity being directly diffused into the semiconductor substrate. This invention utilizes the above facts.

Further, this invention utilizes the fact that the insulating film such as a nitrate film does not permit the diffusion therethrough of an impurity such as boron, even if the film is thin, as described previously. Namely, in the manufacturing of transistors of both modes on the same substrate, a gate insulating film is formed at the position of the gate electrode of each element and an insulating film (such, for example, as a silicon nitride $Si_3N_4$ film) resistant to the diffusion of an impurity, is formed on the gate insulating film of the one element and then the aforementioned impurity is diffused, thus simultaneously providing a transistor element in which the aforesaid impurity has not been diffused into the gate insulating film and no electric field is established and a transistor element in which the aforementioned impurity has been diffused into the gate insulating film and electric field is established. In this example, if the impurity diffuses into the surface of the semiconductor through the gate insulating film of the latter transistor element, the impurity concentration distribution in the surface of the substrate is altered to form a channel.

To sum up, the methods described above are classified as follows:

1. A method in which an impurity is held as a charge in the gate insulating film to prevent diffusion of an impurity into the semiconductor substrate.

2. A method in which an impurity is diffused through the gate insulating film to change the impurity concentration distribution in the surface of the semiconductor substrate.

Each of the above methods includes a method wherein the insulating films are formed of the same insulating material and a method that different insulating films are formed one on another. The techniques therefor will be well understood from the examples of this invention, described below.

BRIEF DESCRIPTION OF THE DRAWINGS

While the specification concludes with claims particularly pointing out and distinctly claiming the subject matter which is regarded as the invention, preferred embodiments are disclosed in the following detailed description taken in conjunction with the accompanying drawings, in which:

DESCRIPTION OF THE PREFERRED EMBODIMENTS

Figure 1:
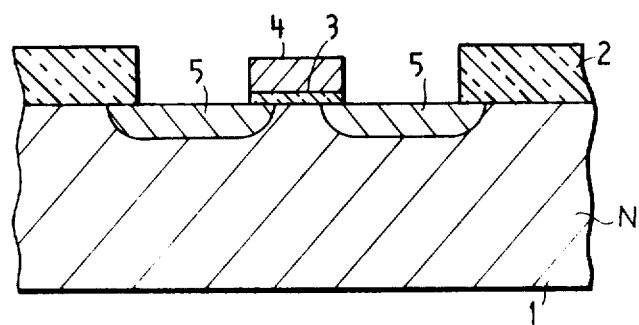
FIG. 1 is a fragmentary perspective view showing a silicon semiconductor substrate prior to a diffusion treatment, for explaining this invention.

To facilitate a better understanding of this invention, the invention will be first outlined and then described in detail in connection with its examples.

One method of manufacturing an IGFET is a silicon gate technique. In accordance with this method, a gate oxide film is formed, a polycrystalline silicon is formed on the gate portion and then impurity diffusion is achieved to form the source and drain and, at the same time, silicon of the gate is made low in resistance. It has been ascertained that if the diffusion is further continued, the impurity is diffused through the silicon of the gate into the gate oxide film to change the surface condition of the semiconductor. More in detail, diffusion of a P-type impurity such as boron produces an immobile negative charge and that of an N-type impurity such as phosphor produces an immobile positive charge. This has been also ascertained in connection with diffusion into a silicon substrate having only a silicon dioxide film. The same results are also obtainable with other insulating films such as an alumina film and a silicon nitride film.

Heretofore, a phosphor treatment, that is, phosphor passivation has been known as a means for stabilization of the gate oxide film. This treatment sometimes causes a decrease in the surface electron concentration $N_{FB}$ and it has been found that this occurs in the case of using the getter action of phosphor and a low impurity oxide film containing a large amount of sodium. The getter action of phosphor is such that sodium ions are moved at a temperature of the phosphor treatment and captured by phosphor, resulting in the surface electron concentration $N_{FB}$. In this invention, however, no sodium ion is used and the surface electron concentration $N_{FB}$ tends to increase. In this invention, ions in the film have far lower mobility than those in a usual phosphor passivation of the low purity oxide film but higher mobility than negative charges caused by the diffusion of boron. In this point, the use of the P-type impurity diffusion is excellent in that the stability of the semiconductor device is increased. In the present invention, the change of the surface condition of the semiconductor due to the impurity diffusion into the insulating film on the surface of the semiconductor is positively utilized for the manufacture of the IGFET. An increase in the amount of an impurity to be introduced by diffusion causes an increase in the amount of charge in the insulating film to increase the influence upon the surface of the semiconductor. This changes the carrier concentration in the semiconductor surface and finally alters the conductivity type in the surface. Namely, a surface inversion layer is formed. For example, where the semiconductor substrate is N-type, negative charges produced in the insulating film by diffusion of a P-type impurity thereinto induces positive charge in the surface of the semiconductor to result in the reduction of the carrier concentration of the N-type semiconductor. With further increase in the negative charge density, that is, the electric field intensity, the conductivity type is reversed to the P-type one. The electric field can be intensified with an increase in the amount of the impurity diffused or with a decrease in the thickness of the insulating film.

Accordingly, the fabrication of the IGFET circuit, in which the depletion mode transistor is coupled as a load with the enhancement mode transistor is made possible by changing the thicknesses of the gate insulating films of both transistors and the intensities of the aforesaid electric fields.

This will become more apparent from the following description taken in conjunction with examples of this invention.

A description will be given first of the manufacture of the IGFET by the aforementioned silicon gate technique.

FIG. 1 is a fragmentary cross-sectional view of a portion of a silicon semiconductor substrate prior to the diffusion treatment. Reference numeral 1 indicates an N-type silicon substrate having an impurity concentration of $5 \times 10^{14} cm^{-3}$ and its surface is in the crystal plane (111). Reference numeral 2 designates a relatively thick oxide film formed by thermal oxidation, 3 a gate oxide film having a thickness of less than 3000A which is formed by re-oxidation after forming windows in the oxide film 2, and 4 a polycrystalline silicon layer having a thickness of less than 7000A which is formed by vapor growth. The layer 4 is patterned as shown prior to the impurity diffusion.

Then, vapor diffusion of boron is carried out. There are the following two methods for the diffusion. In a first method, deposition is achieved at 1000° C for 20 minutes by using boron tribromide held at 25° C; the sheet resistance in this case is 30Ω/□. A running treatment is carried out at 1100° C for 45 minutes and the sheet resistance is 40Ω/□. P-type regions 5 of the source and the drain are formed to a depth of 1.8 microns. In a second method, deposition is achieved at 1040° C for 45 minutes by using boron tribromide similarly held at 25° C; the sheet resistance is 20Ω/square and the diffusion depth is 1.8 microns.

Figure 2:
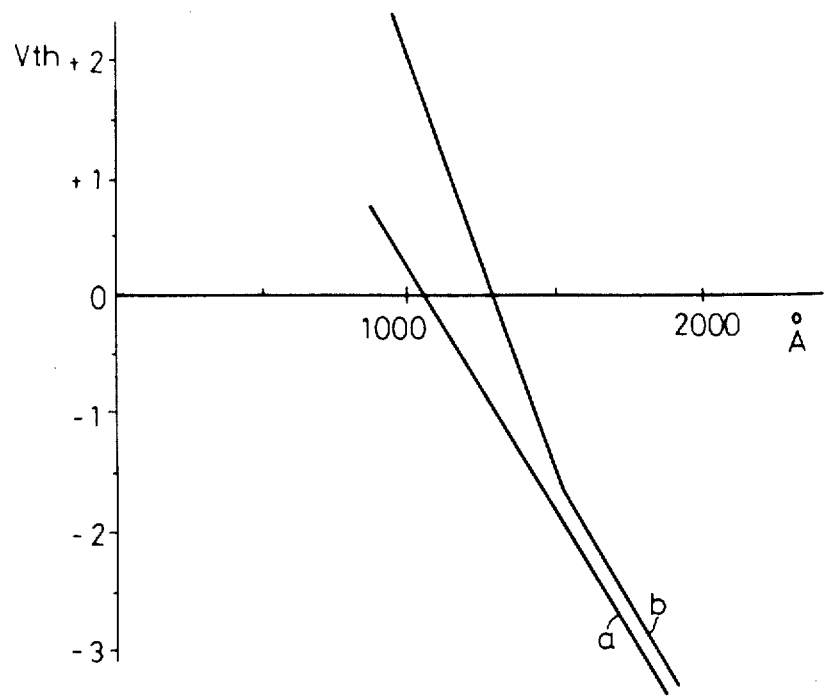
FIG. 2 is a characteristic diagram showing a change in a threshold voltage when the thickness of the gate oxide film is altered in the example of FIG. 1.

The threshold voltage necessary for conduction between the source and the drain was measured after the diffusion treatment described above. A change in the threshold voltage dependent upon the thickness of the gate oxide film is such as shown in FIG. 2. A curve $a$ shows the result of the diffusion achieved under the former condition and a curve $b$ the result of the diffusion under the latter condition. The surface concentrations are $3.5\times10^{19}cm^{-3}$ and $7\times10^{-19}cm^{-3}$, respectively. The thermal oxidation film usually induces electrons in the order of $10^{12}cm^{-3}$ in the surface electron concentration but where boron is diffused into the gate oxide film through polycrystalline silicon, a negative charge is produced in the film to induce positive charge in the surface of the semiconductor. The conductivity type under the gate measured after the oxide film was removed was N-type. This implies that the P-channel is formed not by the diffusion of boron into silicon but by the formation of a negative charge in the oxide film due to the diffusion of boron into the oxide film.

With the curve $b$ in FIG. 2, if the gate oxide film is 1000A in thickness, the threshold voltage is +2V, and if the film is 1500A, the threshold voltage is −1.5V. It is possible to obtain P-channel depletion and enhancement mode transistors respectively.

In order that the P-channel depletion mode transistor may be used as a load for the P-channel enhancement mode transistor, the source of the former and the drain of the latter are interconnected, and the former transistor is held in the on state under normal conditions. To this end, the gate of the former is connected to the connection point between the transistors.

Figure 3:
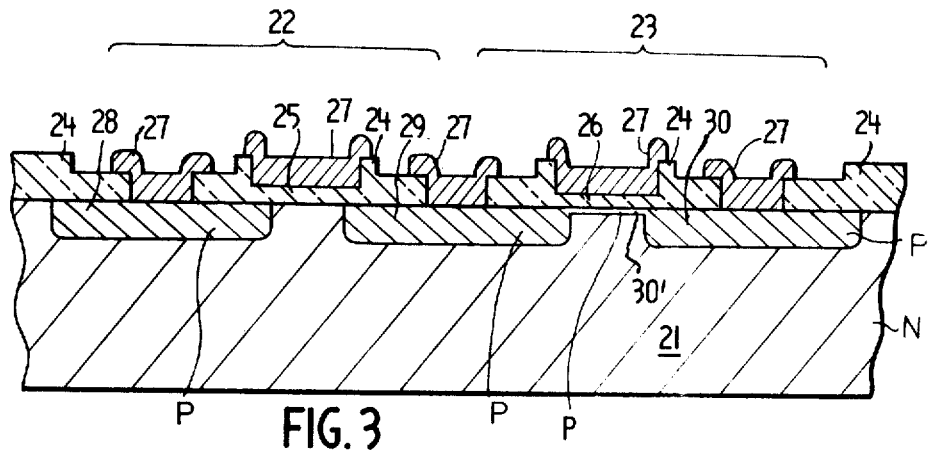
FIG. 3 is a cross-sectional view illustrating a transistor pair in accordance with another example of this invention in which P-channel transistors of enhancement and depletion modes are coupled with each other by a method of manufacturing a usual MOS transistor.

Referring now to FIG. 3, a description will be given of a method of manufacturing transistors of both modes by the most basic method without employing the silicon gate technique.

The manufacture starts with thermal oxidation of an N-type semiconductor substrate 21 to form a thick oxide film 24 thereon. Then, windows are formed in the oxide film 24 by means of photoetching, through which windows a P-type impurity is diffused into the substrate 21 to form P-type regions 28, 29 and 30 which will ultimately serve as the source and the drain respectively. An enhancement mode transistor 22 is formed between the regions 28 and 29, and a depletion mode transistor 23 between the regions 29 and 30. The region 29 serves as the source and drain of the two transistors, thereby to provide for enhanced degree of integration.

Then, the thick oxide film 24 is selectively removed for the formation of the gate oxide film. At first, only a gate oxide film 25 of the transistor, which will ultimately be of enhancement mode, is formed by thermal oxidation half as thick as the film desired to be formed, that is, thick enough to be formed to the desired thickness by the subsequent thermal oxidation. Then a gate oxide film 26 of the depletion mode transistor is formed by thermal oxidation to a desired thickness and, at the same time, the aforementioned gate oxide layer 25 is formed to the desired thickness. Then, a P-type impurity diffusion is achieved. Thus, the P-type impurity is introduced into the gate oxide films 25 and 26; but, the oxide film 26 is thin and the negative charge therein is of an electric field intensity high enough to provide a P-channel 30'. On the other hand, the oxide film 25 is relatively thick, and the negative charge therein has no sufficient electric field. In addition, the surface of the substrate immediately below the oxide film 25 remains of an N-type and the enhancement mode transistor is provided. Reference numeral 27 identifies respective electrodes.

With the present invention an N-channel transistor is produced in the following manner.

Figure 4:
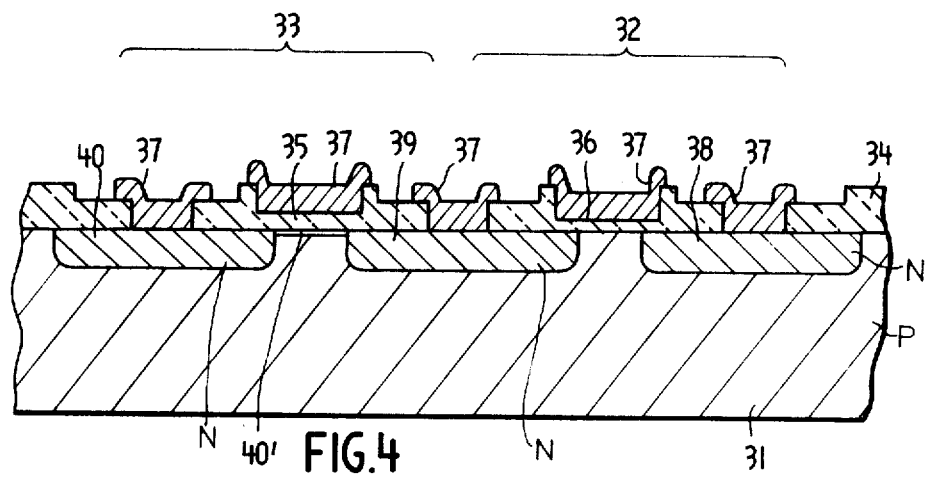
FIG. 4 is a cross-sectional view of an N-channel transistor pair according to another example of this invention.

In the example of FIG. 4, a thick oxide film 34 is formed on a P-type substrate 31 having an impurity concentration of about $10^{14}cm^{-3}$ and is selectively removed as by photoetching to form windows, through which an N-type impurity is diffused into the substrate 31 to form N-type regions 38, 39 and 40 therein. Enhancement and depletion mode transistors 32 and 33 are formed between the regions 38 and 39 and between 39 and 40 respectively. In this embodiment, a thick gate oxide film 35 is previously formed by thermal oxidation to a certain thickness and then a thin gate oxide film 36 is formed, after which a P-type impurity is diffused.

The gate oxide film 35 is relatively thick and the negative charge due to the P-type impurity introduced into the film 35 does not have sufficient electric field; as a result an N-channel 40' is formed by the positive charge (especially sodium ions or the like) which is originally present in the film. However, the gate oxide film 36 is relatively thin and the negative charge due to the P-type impurity diffused thereinto, establishes an electric field of sufficiently high intensity that the positive charge in the oxide film 36 compensates for the silicon surface becoming N-type, by which the semiconductor surface immediately below the oxide film 36 is held P-type. Thus, the enhancement mode transistor 32 is provided under the gate oxide film 36 and the depletion mode transistor 33 is formed under the gate oxide film 35. Reference numeral 37 designates respective electrodes.

Figure 5:
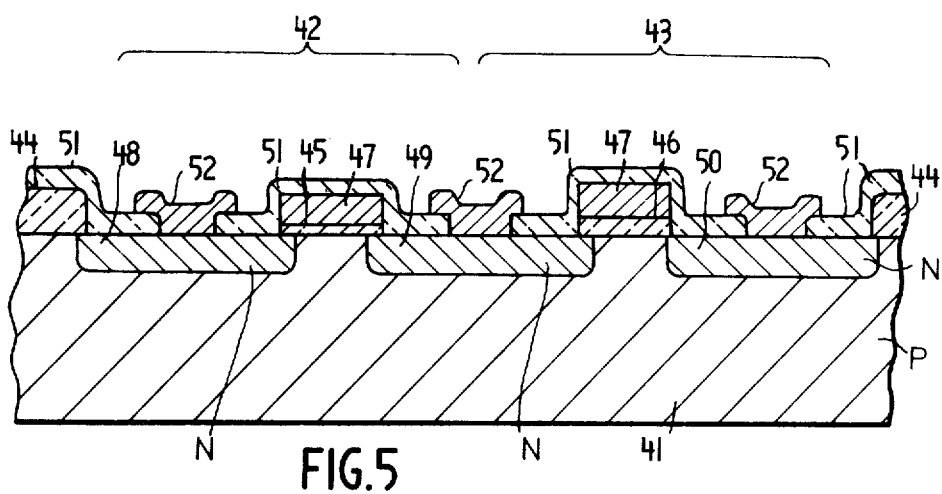
FIG. 5 is a cross-sectional view of an N-channel transistor pair produced by silicon gate techniques according to another example of this invention.

In FIG. 5, there is depicted an example of manufacturing an N-channel IGFET by using the silicon gate techniques.

In the embodiment of FIG. 5, a P-type substrate 41, identical with that employed in the above example, is used, on which a thick oxide film 44 is formed. The oxide film 44 is removed at a selected area including all of the diffused regions to be subsequently formed, thus forming a window. An oxide film is formed by thermal oxidation to a certain thickness and then removed to form a window therein at an area where a gate oxide film 45 of an enhancement mode transistor 42 is to be formed, and oxidation is carried out again, by which a desired relatively thin oxide film is formed, while at the same time, the desired relatively thick oxide film is formed. In this example, the next step is doping with a P-type impurity. Then, polycrystalline silicon is formed by vapor growth, and a polycrystalline silicon layer 47 ultimately serving as a gate electrode and gate oxide films 45 and 46 are formed by patterning. Then the surface of the silicon substrate is exposed at those areas into which an N-type impurity will subsequently be diffused to form the source and drain. Then, the source and drain diffused regions 48, 49 and 50 are formed by the N-type impurity diffusion and, at the same time, the N-type impurity is also diffused into the silicon layer 47 to make it conductive, which leads to the formation of an apparently new oxide film 51.

Thus, the enhancement and depletion mode transistors 42 and 43 are formed under the gate oxide films 45 and 46 respectively for the same reasons as those in the above example.

In any of the foregoing examples, the surface condition is controlled by the diffusion of the P-type impurity; however, the control of the surface condition is also possible with the use of an N-type impurity.

Phosphor silicate glass is formed by heating to cause phosphor to diffuse into high purity silicon dioxide having a surface electron concentration $N_{FB}$ of less than $10^{13} cm^{-3}$. However, the surface electron concentration $N_{FB}$ is not decreased by gettering sodium ions as is well-known in the art, but instead the phosphor introduced into the film provides a positive charge to increase the surface electron concentration $N_{FB}$. This has been ascertained by the fact that, in the manufacturing of the N-channel transistor according to this invention, the threshold voltage increases unlike in the conventional phosphor passivation.

Thus, with the present invention, control of the surface condition of a semiconductor is possible by the doping of the gate insulating film with an impurity, in which case the impurity diffusion is controllable and its reproducibility is satisfactorily high. Further, with the use of the effects of this invention, it is possible to produce both enhancement and depletion mode transistors in the respective conduction channels. In particular the use of the silicon gate techniques enables a transistor pair of both mode transistors coupled with each other to be produced with the prior art processes without the necessity of adding any process for the impurity doping in this invention.

Figure 6A:
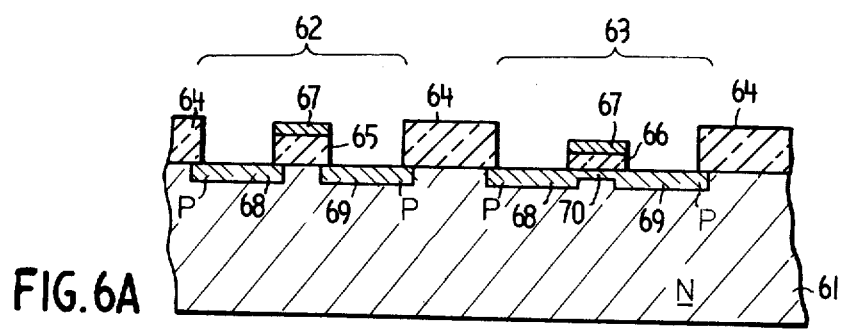
FIGS. 6A and 6B illustrate in section the steps for manufacturing a semiconductor device by the method of this invention.
Figure 6B:
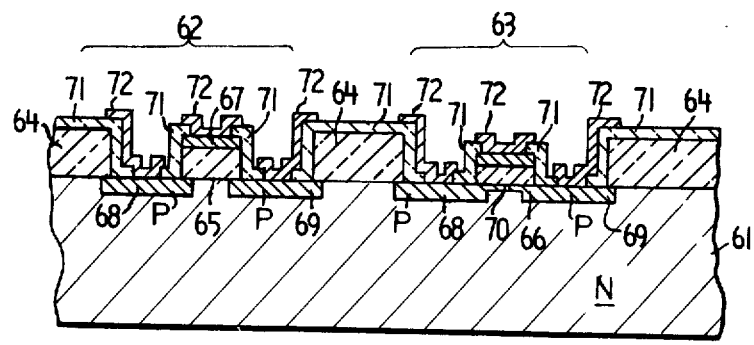

FIGS. 6A and 6B show steps involved in the manufacture of a semiconductor device according to another example of this invention.

In FIGS. 6A and 6B, reference numeral 61 indicates, for example, an N-type silicon semiconductor substrate; 62 a region of an enhancement mode transistor; 63 a depletion mode transistor; 64 a thick thermal oxidation film as of silicon dioxide; 65 a gate insulating film of the enhancement mode transistor which is formed of, for example, silicon dioxide; 66 a similar gate insulating film of the depletion mode transistor; 67 a polycrystalline semiconductor film; 68 source diffused layers of, for example, P-type conductivity; 69 drain diffused layers of, for example, P-type conductivity; 70 an impurity diffused layer (a conductive channel) of the same conductivity as the source and drain diffused layers 68 and 69; 71 an insulating layer as of silicon dioxide; and 72 conductive layers manufacturing up electrodes. In this example, an impurity is diffused into the surface of the semiconductor substrate through the gate insulating layer 66.

The semiconductor substrate 61 is an N-type silicon semiconductor one, which has an impurity concentration of, for example, $1.5 \times 10^{15}$ atoms/cm$^3$ and a crystal orientation in the 111 plane. The thermal oxidation film 64 of silicon dioxide is formed to a thickness of about 0.1 micron over the entire area of the surface of the semiconductor substrate 61 and the oxide film 64 is selectively etched away to form windows therein corresponding to the regions of the transistors 62 and 63 as shown in FIG. 6A. Then, the gate insulating films 65 and 66 of the enhancement and depletion mode transistors 62 and 63 are formed to a thickness of about 1500A and 1000A, respectively. Next, the polycrystalline silicon semiconductor films 67 are formed approximately to a thickness of 0.8 microns on the gate insulating films, respectively. In this embodiment, it is possible to use known techniques of silicon gate self-alignment.

Then, the polycrystalline silicon film and the silicon oxide film overlying other areas than the gate areas are etched away to form windows. After this, an impurity opposite in conductivity type to the semiconductor substrate 61, is diffused through the windows into the semiconductor substrate 61 as shown in FIG. 6A. Where the impurity is boron, it is diffused into the exposed source and drain regions and, at the same time, diffused thereinto through the polycrystalline semiconductor films 67 and the gate insulating films 65 and 66, respectively. In this example, since the gate insulating film 66 of the depletion mode transistor is thin, the impurity, i.e., boron, passes through the gate insulating film 66 to provide the impurity diffused layer 70 immediately below it. While, since the gate insulating film 65 on the side of the enhancement mode transistor 62 is thick, such an impurity diffused layer 70 as above mentioned is not formed and the source and drain diffused layers 68 and 69 are isolated from each other by the N-type region of the semiconductor substrate 61 lying therebetween. The source and drain diffused layers 68 and 69 have a surface impurity concentration of $3.0 \times 10^{19}$ atoms/cm$^3$ and a diffusion depth of about 2 microns, while the impurity diffused layer 70 has a surface impurity concentration of $3.0 \times 10^{15}$ atoms/cm$^3$ and a diffusion depth of about 0.45 microns. These values are favorable for the depletion mode transistor.

Subsequent to the formation of the diffused layers 68, 69 and 70 described above, the surface of the semiconductor substrate 61 including the layers exposed thereon is entirely covered again, as shown in FIG. 6B, with insulating film 71 of silicon dioxide, which is selectively removed to form windows to expose the source, drain and gate regions, and then conductive layers 72 are formed by vapor deposition or the like.

According to this example, in the manufacturing of the both enhancement and depletion mode transistors on the same semiconductor substrate, the formation of the impurity diffused layer 70 is controlled by controlling the thicknesses of the gate insulating films 65 and 66 based upon the fact that the impurity, i.e., boron, is diffused into the semiconductor substrate 61 through a thin insulating film 66 as of silicon dioxide, as described above. Therefore, the impurity diffused layer 70 necessary for the depletion mode transistor can be formed immediately below the gate insulating film 66 simultaneously with the diffusion process for the source and drain diffused layers 68 and 69, thus simplifying the fabrication of this kind of semiconductor device.

The characteristics of the transistors produced according to the example of this invention such as described above were such that Vth=−2V and Vth=+2V in the enhancement and depletion mode transistors respectively.

With reference to FIGS. 7 to 10, other examples of this examples of this invention will hereinbelow be described which employ a nitride insulating film.

Figure 7:
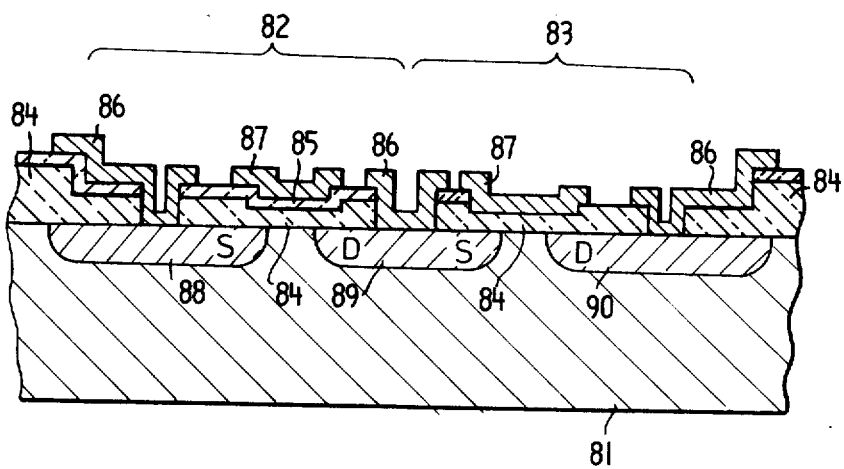
FIGS. 7 to 10 shows other examples of this invention employing a nitrate insulating film, FIGS. 7 and 8 illustrating examples in which an impurity (boron) is diffused into the one gate insulating film to provide an electric field and FIGS. 9 and 10 showing examples in which the impurity (boron) is diffused through the one gate insulating film to change the impurity concentration in the surface of a semiconductor substrate.

In FIG. 7, reference numeral 81 indicates a semiconductor substrate; 82 a region of an enhancement mode transistor; 83 a depletion mode transistor; and 84 an insulating film as of silicon dioxide. Reference numeral 85 identifies an insulating film different from the gate insulating film 84 and formed of, for example, silicon nitride (Si$_3$N$_4$) or like material such that its diffusion coefficient to an impurity, into which it is dipped in a subsequent process, is lower than that of the gate insulating film 84. Reference numeral 86 designates source of drain electrodes; 87 gate electrodes; and 88, 89 and 90 diffused layers ultimately serving as sources S and drains D. In FIG. 7, the left-hand gate electrode 87 constitutes a first field effect transistor element 82 together with the source and drain electrodes 86 on both sides of the electrode 87, and the right-hand gate electrode 87 in FIG. 7 constitutes a second field effect transistor element 83 together with the source and drain electrodes 86 on both sides thereof. The transistor element 82 on which the insulating film 85 is formed becomes of depletion mode in the case where the impurity to be dipped in the subsequent process is an impurity which makes the conductivity type of the semiconductor the same a that of the diffused layers 88, 89 and 90, and the transistor element 82 becomes of enhancement mode where the above impurity is such an impurity as makes the semiconductor opposite in conductivity type to the diffused layers 88, 89 and 90. The enhancement mode transistor element acts as an ordinary field effect transistor and the depletion mode transistor element is used as, for example, a load resistor. Both of the elements are connected in series to each other through the central electrode 86 in FIG. 7, so that this central electrode 86 serves as the drain and source electrodes D and S.

The E-D element is produced in the following manner. Namely, the thin gate insulating film 84 of silicon dioxide is formed on the silicon monocrystalline substrate 81 of, for example, N-type conductivity, and the thin silicon nitride (Si$_3$N$_4$) insulating film 85 is formed on the gate insulating film of the one transistor element. Then the polycrystalline silicon layers 87 ultimately serving as gate electrodes are formed on the gate insulating films of the both elements. Thereafter, the entire assembly is subjected to impurity diffusion. In the present example, this semiconductor impurity is boron which makes the semiconductor P-type. Boron is easily diffused into the polycrystalline silicon films 87 and also diffused into the silicon dioxide film if it is relatively thin. Further, even if the silicon nitride (Si$_3$N$_4$) film is thin, boron is completely prevented by the film from passage therethrough. As a result of this, the transistor element having the silicon nitride (Si$_3$N$_4$) film becomes of enhancement mode, while in the other transistor element boron is diffused into the gate insulating film to establish electric field therein to exert an influence on the substrate 81 and this transistor element 83 is thereby caused to become of depletion mode.

Figure 8:
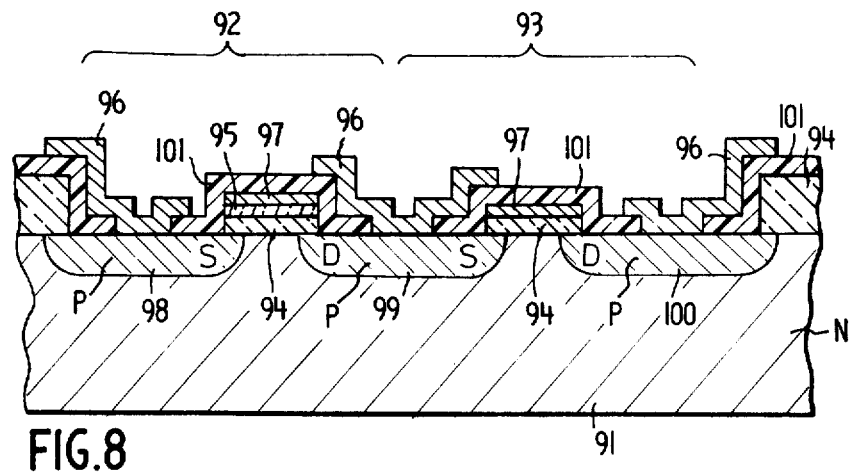

FIG. 8 illustrates the case of a self-alignment structure employing a polycrystalline semiconductor, which is identical in construction with the example of FIG. 7 but different in its manufacturing process from the latter on account of the self-alignment structure. The manufacture of the device depicted in FIG. 8 will be described. The manufacture begins with an N-type silicon semiconductor substrate 91 having an impurity concentration of 1.5×10$^{15}$ atoms/cm$^3$, and a silicon dioxide film having a thickness of 1200A is formed by thermal oxidation as a gate insulating film 94 on the entire area of the surface of the substrate 91. Next, a silicon nitride film 95 is formed 100A thick on the insulating film 94 and is then selectively removed at an area overlying the gate region of the transistor element 93 which will ultimately become of depletion mode. After this, polycrystalline silicon is formed about 1 micron thick all over the surface of the substrate 91 including the films formed thereon and is selectively etched away except those areas overlying the gate regions. Then, the insulating films except those on the gate regions are removed in order of the films 95 and 94 with the remaining polycrystalline silicon films 97 being used as etching masks, thus exposing the surface of substrate 91 at those areas into which a P-type impurity is to be diffused. In the formation of P-type diffused layers 98, 99 and 100, boron is used as the impurity therefor and their surface impurity concentration is 4×10$^{19}$atoms/cm$^2$. The transistor element 92 having the insulating films 94 and 95 is of enhancement mode and its characteristic is Vth=−1V, while the other transistor element 93 having only the insulating film 94 is of depletion mode are formed and then source and drain electrodes 96 are provided, thus completing an E-D element. In the case where the gate electrodes 96 are formed of aluminum, impurity diffusion is carried out prior to their formation.

In accordance with this example, the E-D element can be produced by simple steps of forming the insulating film 95 of a material difficult of impurity diffusion on the gate portion of the one element and then perform impurity diffusion. Further, this method is advantageous in that reproducibility is excellent.

Figure 9:
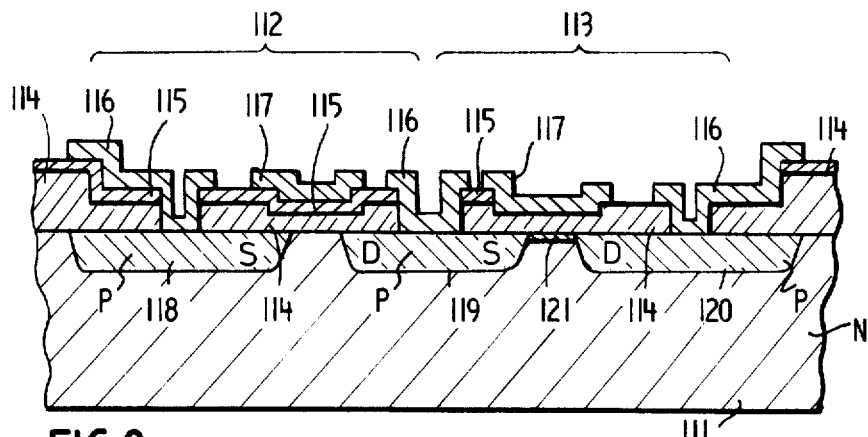
Figure 10:
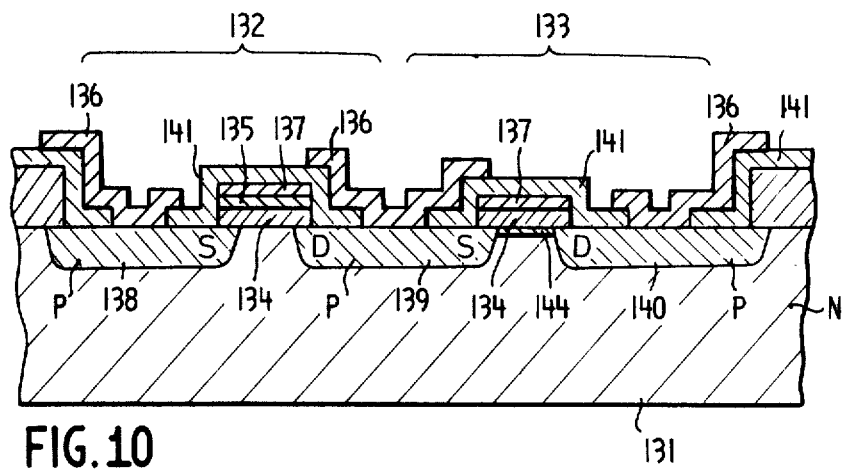

The examples of FIGS. 9 and 10 are substantially similar to those described above in connection with FIGS. 7 and 8, but the present examples have the following feature. Namely, in the case where a normally cutoff-type (enhancement type) and a normally conducting (depletion type) field effect transistor elements are simultaneously formed on the same semiconductor substrate, gate insulating films are formed in the positions of the gate electrodes of the respective elements, an insulating film difficulty of impurity diffusion is formed on the gate insulating film of the one element and the aforementioned impurity diffusion is carried out, thus simultaneously providing a transistor element in which the impurity has not been diffused in the surface of the semiconductor substrate through the gate insulating film and a transistor element in which the impurity has been diffused in the surface of the semiconductor substrate through the gate insulating film. In other words, the present examples are different from that of FIGS. 7 or 8 in that the impurity is diffused through the gate insulating film into the surface of the semi-conductor substrate to change the impurity concentration therein.

In FIG. 9, reference numeral 111 indicates a semiconductor substrate; 112 a region of an enhancement mode transistor; 113 a depletion mode transistor; and 114 insulating films as of silicon dioxide. Reference numeral 115 designates an insulating film different from the gate insulating films 114 which is formed of, for example, silicon nitride (Si$_3$O$_4$). That is, the insulating film 115 is formed of a material such that its diffusion coefficient to an impurity, in which the assembly is dipped in a subsequent process, is smaller than that of the gate insulating films 114. Reference numeral 116 identifies source or drain electrodes; 117 gate electrodes; and 118, 119 and 120 diffused layers which will subsequently serve as sources S and/or drains D.

In FIG. 9, a left-hand gate electrode 117 constitutes a first field effect transistor element 112 with source and drain electrodes 116 on both sides of the electrode 117, and a right-hand gate electrode 117, constitutes a second field effect transistor element 113 with source and drain electrodes 116 on both sides of the electrode 117. Where an impurity used for dipping in a subsequent process is such an impurity as makes the conductivity type of the semiconductor the same as that of the diffused layers 118 and 119, the transistor element 112 having the insulating film 115 becomes of depletion mode, and if the impurity is such as making the conductivity type of the semiconductor opposite to that of the diffused layers 118 and 119, the transistor element 112 becomes of enhancement mode. The enhancement mode transistor element acts as an ordinary field effect transistor and the depletion mode transistor element is used as, for example a load resistor. These elements are connected in series to each other through the central electrode 116 shown in FIG. 9, so that this central electrode 116 performs the functions of the drain and source electrodes D and S.

This E-D element is produced in the following manner. Namely, the thin gate insulating film 114 of silicon dioxide is selectively formed on the surface of the silicon monocrystalline substrate 111 of, for example, N-type conductivity, and the thin insulating film 115 of silicon nitride ($Si_3N_4$) is formed on the gate insulating film 114 of the one transistor element 112. Then the polycrystalline silicon layers 117 serving as gate electrodes are formed on the gate insulating films of the both elements. Thereafter, the entire assembly is subjected to impurity diffusion. In the present example, the semiconductor impurity is boron which makes the semiconductor P-type. Boron is readily diffused into the polycrystalline silicon film 117 and also diffused into the silicon dioxide film, if it is relatively thin. However, even if the silicon nitride $Si_3N_4$ film is thin, the impurity is completely prevented by the film 115 from the passage therethrough and cannot reach the surface of the semiconductor substrate 111. As a result of this, the transistor element 112 having the $Si_3N_4$ film 115 becomes of enhancement mode, and in the other transistor element 113 having no $Si_3N_4$ film, boron diffuses in the surface of the semiconductor substrate to provide a channel 121 to cause the transistor element to become of depletion mode.

FIG. 10 illustrates the case of the self-alignment structure employing a polycrystalline semiconductor, which is identical in construction with the example of FIG. 9 but different therefrom in its manufacturing process. The manufacture starts with the preparation of an N-type silicon semiconductor substrate 131 having an impurity concentration of $1.5\times10^{15}$atoms/cm$^3$, on the surface of which a silicon dioxide film having a thickness of 1200A is formed by thermal oxidation as a gate insulating film 134. Further, a silicon nitride film 135 is formed 100A thick on the insulating film 134. Then, the silicon nitride film 135 on the gate region of the transistor element 132, which will ultimately become of depletion mode, is removed. Next, polycrystalline silicon is formed about 1 micron thick as a gate electrode material on the entire area of the surface of the assembly and selectively etched away except at those areas overlying the gate regions. After this, the insulating films except those on the gate regions are removed in order of the film 135 and 134 with the remaining polycrystalline silicon films 137 being used as etching masks, thus exposing the surface of the substrate 131 at those areas into which a P-type impurity is to be diffused. In the formation of P-type diffused layers 138, 139 and 140, boron is used as the impurity therefor. The P-type diffused layers have a junction depth of 1.8 microns and a surface impurity concentration of $8\times10^{19}$atoms/cm$^2$ respectively. The transistor element 132 having the insulating films 134 and 135 is of enhancement mode and has a characteristic Vth=$-$2.5V, while in the transistor element 133 having only the insulating film 134, a channel 142 is formed and the element becomes of depletion mode and has a characteristic Vth=$-$2V. After silicon dioxide films 141 are formed around the gate electrodes 137 and so on, source and drain electrodes 136 are provided to complete an E-D element. Where gate electrodes 137 are formed of aluminum, the impurity diffusion is carried out before the formation thereof.

In accordance with this example, the E-D element can be produced by simple processes of forming an insulating film difficult of impurity diffusion on the gate portion of the one transistor element and then diffusing the impurity and this method is advantageous in that reproducibility is excellent.

The foregoing has described in detail some examples of the manufacturing method of this invention. Next, a description will be given in connection with some examples of field effect transistors practically produced according to this invention. The following examples are those of a P-channel silicon gate system and will be described in connection with the manufacture of MOS transistors of enhancement and depletion modes while being classified into the following two cases: (A) the case of forming an inductive channel in a semiconductor substrate, and (B) the case of diffusing an impurity into a semiconductor substrate through a gate insulating film.

A. Method of causing an impurity to exist as negative charge in the gate insulating film.

This method is to form an inductive channel in the semiconductor substrate without diffusing an impurity into a silicon substrate. This method is divided into two kinds of methods as follows.

a. Method of using two kinds of insulating films.

The characteristics of the semiconductor substrate, the thicknesses of the gate insulating film and the threshold voltage (Vth) used in this method are such as given in the following table.

Table 1

| Substrate | N-type Silicon semiconductor, impurity concentration: $1.5\times10^{15}$atoms/cm$^3$ resistivity: 3$\Omega$-cm, crystal orientation:(100) | |
|---|---|---|
| Mode | Enhancement mode | Depletion mode |
| Kind and thickness of gate insulating film | $SiO_2$, 1200A + $Si_3N_4$, 100A | $SiO_2$ 1200A |
| Vth | $-$1.5V | $+$0.5V |

The diffusion process includes pre-deposition and drive-in diffusion. The pre-deposition is to deposite $B_2O_3$ on the surface of the silicon substrate using $BBr_3$ and dry $O_2$ to form a thin diffused layer in the surface of the substrate. The sheet resistivity in the surface of the substrate is 20$\Omega$/square. The drive-in diffusion involves two diffusion operations. At first, in the pretreatment, wet $O_2$ produced by passing dry $O_2$ through water of 50° C is controlled at a flow rate of 2l/min. and diffusion is carried out at 950° C for 15 minutes. The reason why wet $O_2$ is used to utilize $H_2$ of vapor to speed up the diffusion. After this, an essential diffusion treatment is achieved, in which diffusion is effected in an atmosphere of dry $N_2$ at 1050° C for 40 minutes. As a result of diffusion into the source S and the drain D, the sheet resistivity is 25Ω/square and the junction depth is 1.2 microns.

b. Method of utilizing the difference in thickness between insulating films of the same kind.

The characteristics of the semiconductor substrate, the kinds and thicknesses of the gate insulating films and the threshold voltage (Vth) used in this method are as given in the following table.

Table 2

| Substrate | N-type silicon semiconductor, Impurity concentration: $1.5\times10^{15}$atoms/cm$^3$, resistivity:3Ω-cm, crystal orientation:(100) | |
|---|---|---|
| Mode | Enhancement mode | Depletion mode |
| Kind and thickness of gate insulating film | $SiO_2$, 1500A | $SiO_2$, 1200A |
| Vth | −1.0V | +0.5V |

The diffusion process include pre-deposition and drive-in diffusion. The pre-deposition is to deposit $B_2O_3$ on the surface of the silicon substrate using $BBr_3$ and dry $O_2$ to form a thin diffused layer in the surface of the substrate. The sheet resistivity in the surface of the substrate is 20Ω/square. The drive-in diffusion involves two diffusion operations. At first, in the pre-treatment, wet $O_2$ produced by passing dry $O_2$ through water of 50° C is controlled at a flow rate of 2l/min. and diffusion is carried out at 950° C for 15 minutes. The reason why wet $O_2$ is used is to utilize $H_2$ of vapor to speed up the diffusion. After this, an essential diffusion is effected in an atmosphere of dry $N_2$ at 1050° C for 40 minutes. As a result of diffusion into the source S and the drain D, the sheet resistivity is 25Ω/square and the junction depth is 1.2 microns.

B. Method of diffusing an impurity into the semiconductor substrate through the gate insulating film.

This method is divided into two kinds of methods described hereinbelow, with which it is possible to obtain transistors of different characteristics by changing the characteristics of the semiconductor substrate, and the kind and thickness of the gate insulating film.

Table 3

| Substrate | N-type silicon semiconductor, impurity concentration:$5\times10^{14}$atoms/cm$^3$, resistivity:10Ω-cm, crystal orientation:(111) | |
|---|---|---|
| Mode | Enhancement mode | Depletion mode |
| Kind and thickness of gate insulating film | $SiO_2$, 1100A + $Si_3O_4$, 100A | $SiO_2$, 1100A |
| Vth | −2.5V | +2.5V |

Table 4

| Substrate | N-type silicon semiconductor, impurity concentration:$1.5\times10^{14}$atoms/cm$^3$ resistivity:3Ω-cm, crystal orientation:(100) | |
|---|---|---|
| Mode | Enhancement mode | Depletion mode |
| Kind and thickness of gate insulating film | $SiO_2$, 1000A + $Si_3N_4$, 100A, | $SiO_2$, 1000A |

Table 4-continued

| Substrate | N-type silicon semiconductor, impurity concentration:$1.5\times10^{14}$atoms/cm$^3$ resistivity:3Ω-cm, crystal orientation:(100) | |
|---|---|---|
| Mode | Enhancement mode | Depletion mode |
| Vth | −1.5V | +5V |

In the examples shown in the above Tables 3 and 4, the diffusion process is such as described hereinbelow and common to both examples.

The diffusion process includes pre-deposition and drive-in diffusion. The pre-deposition is to deposite $B_2O_3$ on the surface of the silicon substrate using $BBr_3$ and dry $O_2$ to form a thin diffused layer in the surface of the substrate. The sheet resistivity in the surface of the substrate is 20Ω/square. The drive-in diffusion involves two diffusion operations. At first, in the pre-treatment, wet $O_2$ produced by passing dry $O_2$ through water of 80° C is controlled at a flow rate of 2l/min. and diffusion is carried out at 1000° C for 15 minutes. The reason why wet $O_2$ is used is to utilize $H_2$ of vapor to speed up the diffusion. This is followed by an essential diffusion treatment, in which diffusion is effected in an atmosphere of dry $N_2$ at 1050° C for 40 minutes. As a result of diffusion into the source S and the drain D, the sheet resistivity is 30Ω/square and the junction depth is 1.2 microns.

The transistors thus obtained have such threshold values Vth as given in the Tables 3 and 4.

b. Method of utilizing the difference in thickness between insulating films of the same kinds.

Table 5

| Substrate | N-type silicon semiconductor, impurity concentration:$5\times10^{14}$atoms/cm$^3$ resistivity:10Ω-cm, crystal orientation:(111) | |
|---|---|---|
| Mode | Enhancement mode | Depletion mode |
| Kind and thickness of gate Insulating film | $SiO_2$, 1500A | $SiO_2$, 1000A |
| Vth | −1.5V | +2.5V |

The dissusion process includes pre-deposition and drive-in diffusion. The pre-deposition is to deposite $B_2O_3$ on the surface of the silicon substrate using $BBr_3$ and dry $O_2$ to form a thin diffused layer in the surface of the substrate. The sheet resistivity in the surface of the substrate is 20Ω/square. The drive-in diffusion involves two diffusion operations. At first, in the pre-treatment, wet $O_2$ produced by passing dry $O_2$ through water of 80° C is controlled at a flow rate of 2l/min. and diffusion is carried out at 1000° C for 15 minutes. The reason why wet $O_2$ is used is to utilize $H_2$ of vapor to speed up the diffusion. This is followed by an essential diffusion treatment, in which diffusion is effected in an atmosphere of dry $H_2$ at 1050° C for 40 minutes. As a result of diffusion into the source S and the drain D, the sheet resistivity is 30Ω/square and the junction depth is 1.2 microns. The threshold voltage Vth of the transistor thus obtained is as given the Table 5.

It will be apparent that many modifications and variations may be effected without departing from the scope of the novel concepts of this invention.

I claim as my invention:

1. A semiconductor device comprising:

a semiconductor substrate of a first conductivity type having a main surface;

first, second and third regions of a second conductivity type, opposite to said first conductivity type, within said semiconductor substrate adjacent said main surface thereof and disposed with respect to each other to form a first channel within said semiconductor substrate between said first and second regions and a second channel within said semiconductor substrate between said second and third regions;

first and second insulating films of SiO$_2$ disposed upon said main surface of said semiconductor substrate overlying said first and second channels thereof, respectively, wherein said first and second insulating films each have a thickness of approximately 1500A and 1000 to 1200A, respectively;

a conductivity modifying impurity of said second conductivity type diffused into each of said first and second insulating films; and said first insulating film being of a sufficiently large thickness such that said impurity of said second conductivity type diffused therein produces a field of a strength insufficient to change the conductivity type of said first channel whereby said first channel and said first and second regions form an enhancement mode transistor, and said second film being of a lesser thickness than said first film such that such impurity of said second conductivity type diffused therein produces a field of a sufficient intensity to alter the conductivity type of said second channel whereby said second channel and said second and third regions form a depletion mode transistor.

2. A semiconductor device as recited in claim 1, wherein said semiconductor substrate is n-type and each of said first, second and third regions and said conductivity modifying impurity is p-type.

3. A semiconductor device comprising:

a semiconductor substrate of a first conductivity type having a first main surface;

first, second and third regions of a second conductivity type opposite to said first conductivity type formed within said semiconductor substrate adjacent to said main surface thereof, said first, second and third regions being arranged with respect to each other to form a first channel in said semiconductor substrate between said first and second regions and a second channel in said semiconductor substrate between said second and third regions thereof;

an impurity of a second conductivity type opposite to said first conductivity type;

first and second insulating films of SiO$_2$ formed on said main surface of said semiconductor substrate having thickness in the range of approximately 1000A to 1100A and respectively covering said first and second channels therein;

a third film of Si$_3$N$_4$ having a thickness of approximately 100A formed on said first insulating film, said third film has a diffusion coefficient with respect to said impurity of said second conductivity type which is lower than the diffusion coefficient with respect to said impurity of said second conductivity type of said first and second insulating films, said impurity of said second conductivity type being formed in said second channel by diffusion through said second insulating layer and said second and third regions forming a depletion mode transistor, and wherein said impurity being absent from said first channel by said third layer inhibiting diffusion thereof said first and second regions forming an enhancement mode transistor.

* * * * *

UNITED STATES PATENT OFFICE
CERTIFICATE OF CORRECTION

Patent No. 4,003,071  Dated January 11, 1977

Inventor(s) Sadaaki Takagi

It is certified that error appears in the above-identified patent and that said Letters Patent are hereby corrected as shown below:

Column 8, line 63, delete "this examples".

Column 14, line 45, change "dissusion" to read --diffusion--.

Signed and Sealed this

Twenty-fourth Day of May 1977

[SEAL]

Attest:

RUTH C. MASON
*Attesting Officer*

C. MARSHALL DANN
*Commissioner of Patents and Trademarks*